US007229305B2

(12) United States Patent
Hirschmann

(10) Patent No.: US 7,229,305 B2
(45) Date of Patent: Jun. 12, 2007

(54) ELECTRICAL PIN-AND-SOCKET CONNECTOR FOR VEHICLE RETENTION SYSTEMS

(75) Inventor: Michael Hirschmann, Laingarten (DE)

(73) Assignee: Amphenol-Tuchel Electronics GmbH (DE)

( * ) Notice: Subject to any disclaimer, the term of this patent is extended or adjusted under 35 U.S.C. 154(b) by 0 days.

(21) Appl. No.: 11/391,433

(22) Filed: Mar. 29, 2006

(65) Prior Publication Data

US 2006/0223355 A1 Oct. 5, 2006

(30) Foreign Application Priority Data

Apr. 2, 2005 (DE) ..................... 10 2005 015 155

(51) Int. Cl.
*H10R 13/625* (2006.01)
*H01R 3/00* (2006.01)

(52) U.S. Cl. ...................................... 439/352; 439/489

(58) Field of Classification Search ................ 439/350, 439/352, 595

See application file for complete search history.

(56) References Cited

U.S. PATENT DOCUMENTS 5,863,214 A * 1/1999 Hanak ........................ 439/352
6,341,972 B1 1/2002 Odorfer
2002/0137397 A1 9/2002 Little

FOREIGN PATENT DOCUMENTS

| | | | |
|---|---|---|---|
| DE | 100 35 726 | A1 | 8/2001 |
| DE | 100 32 234 | A1 | 1/2002 |
| DE | 101 51 956 | A1 | 7/2002 |
| DE | 102 24 757 | B3 | 1/2004 |
| DE | 102 27 016 | B4 | 6/2004 |
| EP | 0 734 100 | A3 | 8/1996 |
| EP | 0 734 100 | A2 | 9/1996 |
| EP | 0 921 600 | A2 | 6/1999 |
| EP | 0 921 600 | A3 | 6/1999 |
| EP | 1 150 389 | | 10/2001 |
| EP | 1 207 591 | A2 | 5/2002 |
| EP | 1 207 591 | A3 | 5/2002 |

OTHER PUBLICATIONS

European Search Report, May 16, 2006.

* cited by examiner

*Primary Examiner*—Briggitte R. Hammond
(74) *Attorney, Agent, or Firm*—Blank Rome LLP

(57) ABSTRACT

The invention concerns an electrical pin-and-socket connector for use between a socket and an electrical control device for a retention system in motor vehicles with a secondary latching device that blocks the connector in a preassembled state in such a way that at first the insertion of the connector in the socket is prevented and only through pressure on the secondary latching device in the insertion direction is the insertion of the connector in the socket facilitated.

13 Claims, 6 Drawing Sheets

ELECTRICAL PIN-AND-SOCKET CONNECTOR FOR VEHICLE RETENTION SYSTEMS

DESCRIPTION

Figure 1:
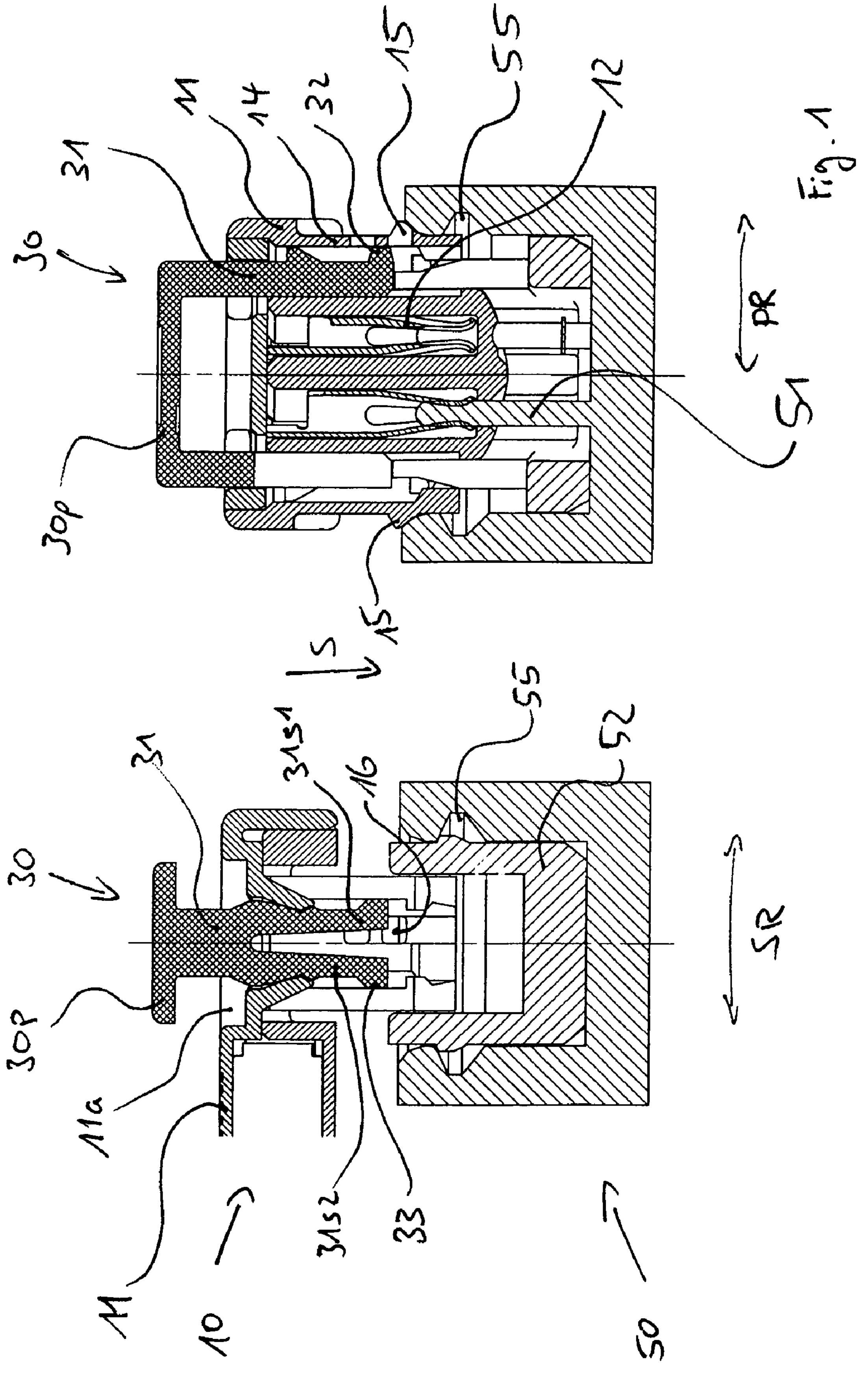

The invention concerns an electrical pin-and-socket connector for use between a socket (primer) and an electrical control device for a retention system in motor vehicles, for example, an airbag.

Such pin-and-socket connectors should, in general, have the smallest possible dimensions due to the limited space in retention systems. From this it follows that for the individual components of the pin-and-socket connectors and the accompanying socket/primer the most desirable characteristic is extremely small structural size, although a light assembly, and high operational safety are also desirable with respect to applications concerning safety regulations (e.g., belt tightener, airbag).

This is especially important with regard to the locking of the connector and socket, whereby the contact elements of the components in the locking state must make secure contact and operational error should be avoided to the greatest extent possible. Likewise, the connector and socket must fasten securely and may not unintentionally detach themselves.

In the prior art this problem is often solved in a procedure whereby in a first step the connector and socket contact each other and lock followed by a second step whereby a locking element, a secondary latching device, is guided behind the catch arms of the connector to secure the lock against unintentional loosening.

With the present invention an alternative structural design for a pin-and-socket connector is presented that fulfills the following requirements:

The secondary latching device should be as independent of the igniter and isolating geometry as possible.

The insertion of the connector in the primer should be brought about exclusively by means of exertion of force on the secondary latching device.

The structural form of the secondary latching device should be as compact as possible.

The locking and the entire insertion process should take place in one step.

The idea of the present invention is to block the connector in a preassembled state with the secondary latching device in such a way that insertion of the connector in the socket or in the isolating ring, inside the socket is at first prevented. Insertion of the connector in the socket or the isolating ring is only then made possible through pressure on the secondary latching device in the insertion direction S.

In this way, during assembly of the socket and the connector, the latching of the secondary latching device cannot be forgotten and assembly of the connector in the primer by other means will be prevented.

Furthermore, the electrical pin-and-socket connector is designed in such a way that the contact is formed only through the application of pressure on the secondary latching device in the insertion directions until the connector is in a completely locked position.

In a preferred embodiment, the invention concerns an electrical pin-and-socket connector with the following characteristics:

a) a connector with a casing for insertion into the socket and for contacting the plug contacts of the connector with the contact pins positioned in the socket;

b) a latch to lock the connector in the socket in a primary latching position by engaging the latch in a corresponding recess in the socket;

c) a secondary latching device guided so that it slides in the insertion direction S of the connector to lock the connector in the primary latching position, the secondary latching device being formed from a base plate with at least one secondary catch arm projecting from the base plate in the insertion direction S;

d) whereby, in a preassembled position, the secondary latching device is positioned relative to the connector so that the latch is blocked and the secondary latching device is movable through the application of force on the secondary latching device, especially through pressure on the base plate, in the insertion direction S with the secondary latching device in a release position relative to the connector in which the latch is released, and the connector is movable through the further action of force on the secondary latching device, especially through pressure on the base plate, in the insertion direction S in the primary latching position.

In a preferred embodiment of the invention it is contemplated that the latch is attached to one of the primary catch arms of the connector, which is oriented in the insertion direction S and protrudes from it, whereby the secondary catch arm, running parallel to the primary catch arm, grasps the primary catch arm from behind on the side opposite the latch. In this manner it is guaranteed that the primary catch arm is hindered by the latch from insertion into the socket. A ramp formed on the secondary catch arm in the insertion direction of the latch causes the primary catch arm 14 to be forced to the middle of the connector until the connector engages in the primary latching position in the latch recess. This entire process is prevented by the secondary catch arm.

The latch is blocked in the preassembled position by a catch hook, which is attached on the secondary catch arm and which essentially protrudes in the direction of the latch on the secondary catch arm. The catch hook can be disengaged from the catch hook recess of the primary catch arm, thereby releasing the latch.

The release of the secondary latching device occurs through the spring action of the catch hook and secondary catch arm, which causes the catch hook to slide over the slanting ramps. After the secondary latching device is released, it slides somewhat deeper along a face of the springable catch hook, which further guides the force acting on base plate of the secondary latching device, allowing for insertion of the connector. In the inserted state, the primary latching position the catch hook rebounds so that the secondary latching device can be completely inserted to lock the catch hook.

The connector locks in the primary latching position in a primary locking direction PR, whereas the secondary latching device locks in a secondary latching position in a secondary locking direction SR, which runs orthogonal to the primary locking direction PR and to the insertion direction S. Thus, the connector is simultaneously locked.

In a preferred embodiment of the invention the secondary latching device has two secondary catch arms, which, moreover, may be designed so they are fork-shaped, with a projection on each leg of the secondary catch arm projecting from the opposite face in the secondary locking direction SR. Both the secondary catch arm and the secondary latching device may be designed so they are axially symmetric.

Further characteristics of the invention follow as exemplified in the claims, description and drawings.

Figure 2:
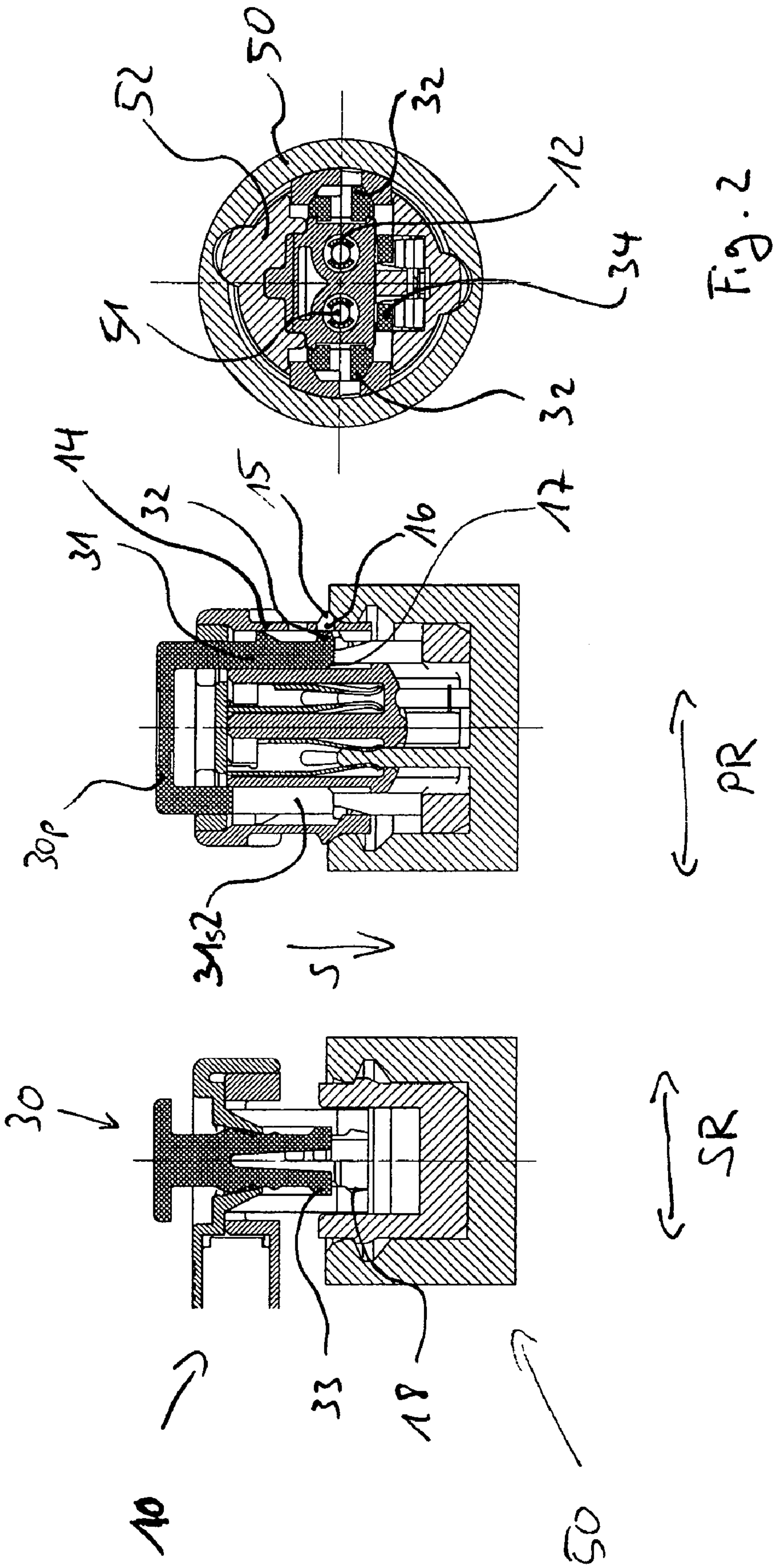
Figure 3:
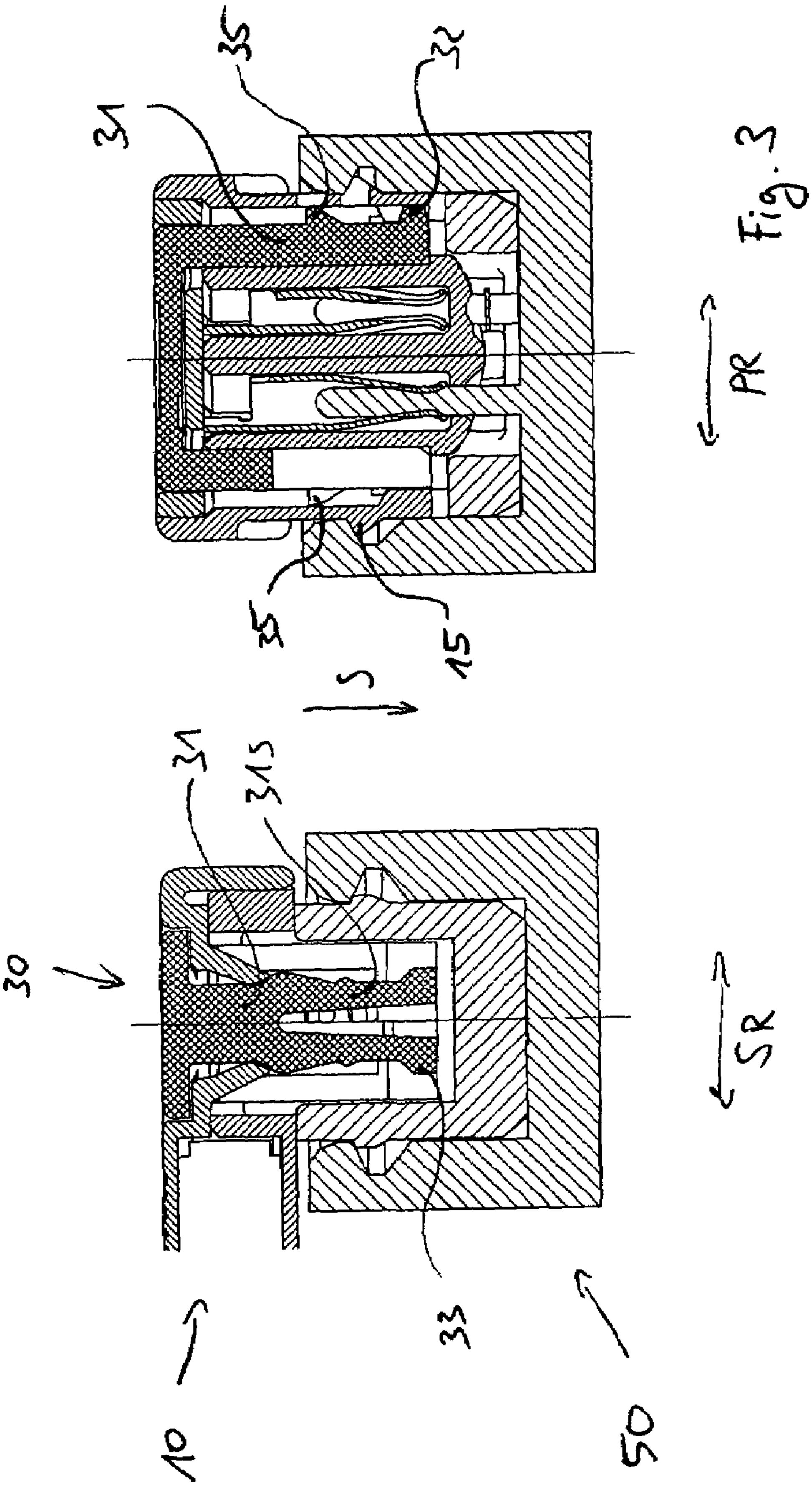
Figure 4:
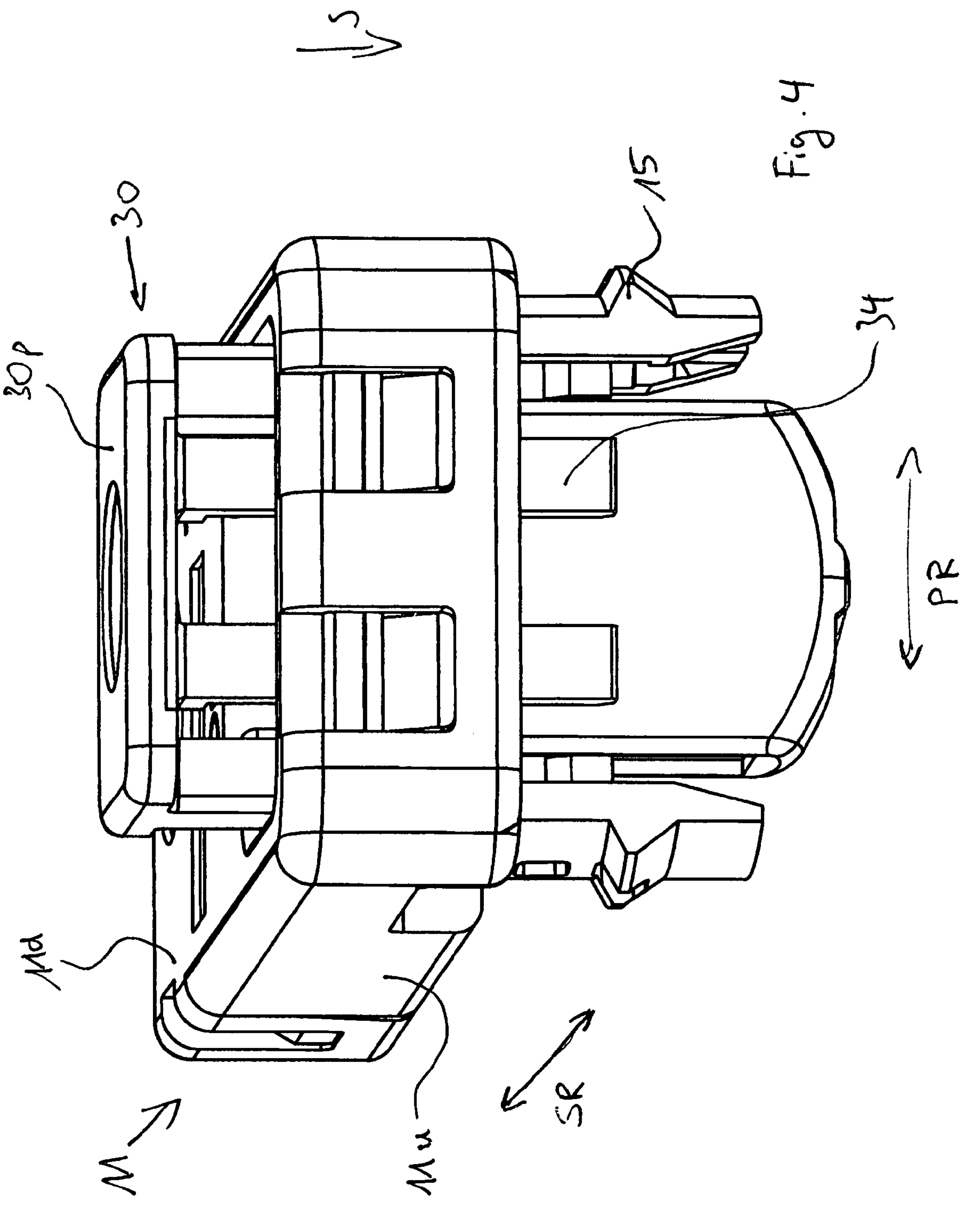
Figure 5:
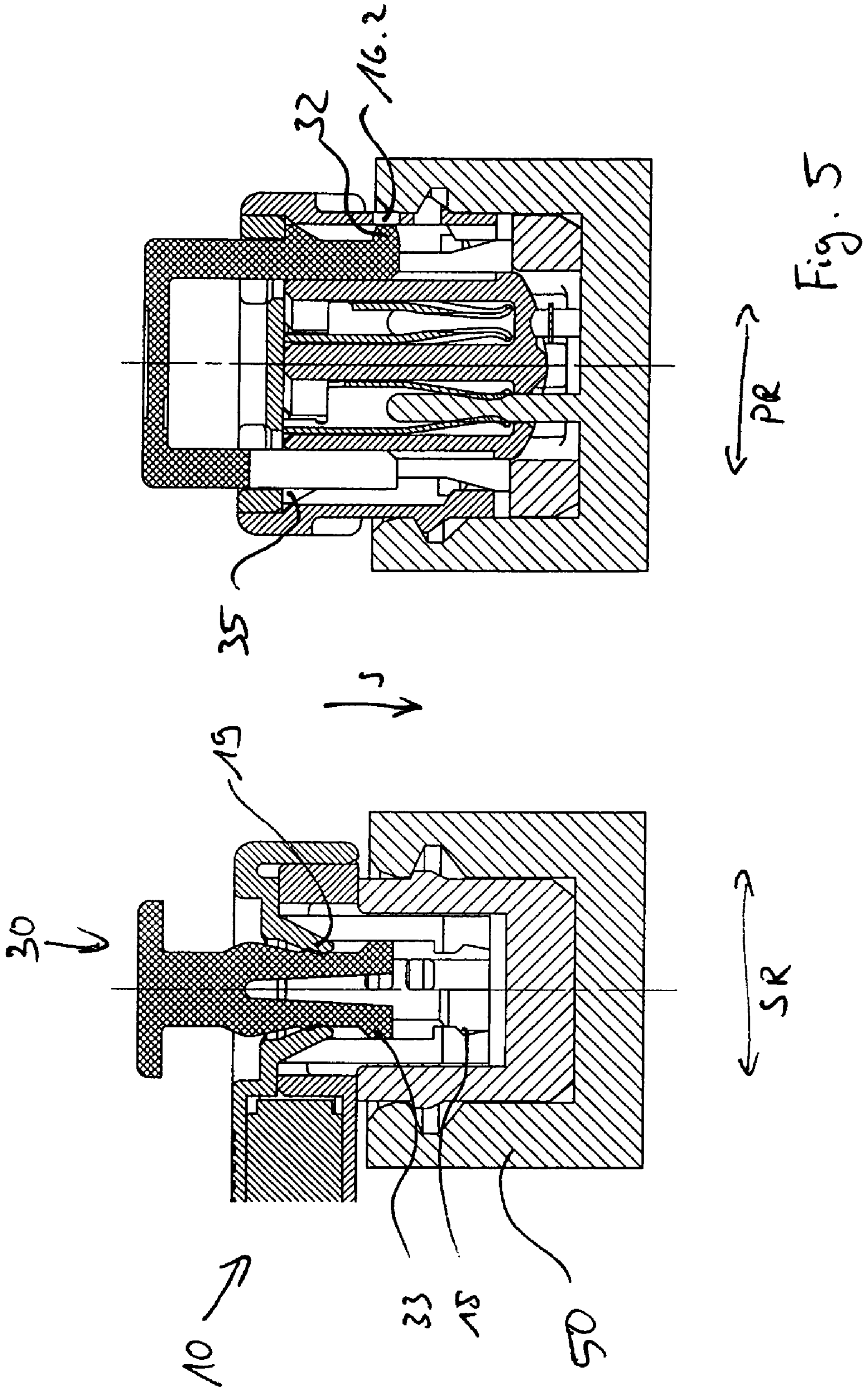
Figure 6:
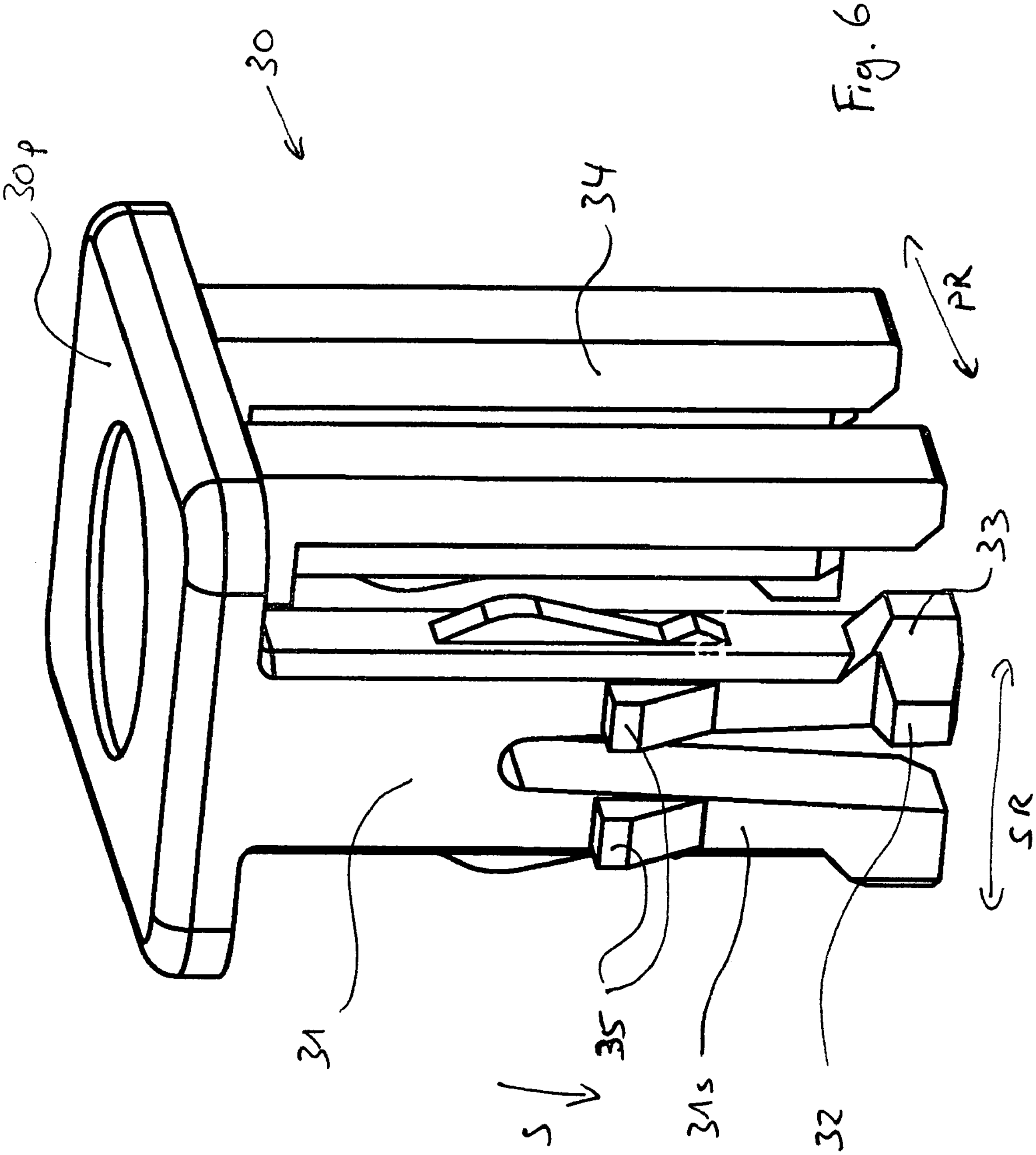

The invention is explained in greater detail below by using non-limiting working examples, and in the following figures:

FIG. 1: a cut-off side and front view of one embodiment of a pin-and-socket connector of the invention in a preassembled a position FIG. 2: various sectional views of one embodiment of an electrical pin-and-socket connector in the release position FIG. 3: a cut-out side and front view of one embodiment of a pin-and-socket connector of the invention in the secondary latching position FIG. 4: a perspective view of one embodiment of an electrical pin-and-socket connector in the preassembled position FIG. 5: a cut-out side and front view of one embodiment of an electrical pin-and-socket connector of the invention in a pull-out position FIG. 6: a perspective view of one embodiment of a secondary latching device of the invention.

FIG. 1A shows a cut-off side view of an electrical pin-and-socket connector according to the invention with a connector 10, which is only partly shown. A secondary latching device 30, which runs through the connector 10 and is also designated as a push button, is also shown. The connector 10 is inserted into an isolating ring 52, which is inserted into a socket 50, together with the secondary latching device 30.

The insertion direction is designated in all the figures by an arrow with the letter S, while a primary locking direction is designated with a double arrow and the letter combination PR. The primary locking direction PR specifies the approximate locking direction in which the primary latching device, in this case side latches 15, spring or lock in place in a latch recess 55 of the socket.

The double arrow with the designation SR indicates the secondary locking direction SR, which specifies the direction in which a locking of the secondary latching device 30 in the secondary latching position occurs as shown in FIG. 3.

The casing 11 of the connector 10 consists of a housing cover 11*d* and a housing shell 11*u*. The casing 11 has passage openings corresponding to the secondary latching device 30, and the base plate 30*p* is designed to fit into a casing recess 11*a* so that the connector 10 locks in the locked position with the top presented as a smooth surface.

As represented in panel A of FIGS. 1, 2, 3, and 5, the side view of the electrical pin-and-socket connector the secondary latching device 30 has the shape of a tuning fork pointing in the insertion direction S, and is connected to the base plate 30*p* at the top. In the cut-off front view shown in panel B of FIGS. 1, 2, 3, and 5, the secondary latching device 30 has an upside-down U shape. The two legs of the U-shaped secondary locking device 30 are formed by the secondary catch arms 31 and are connected to one another through the base plate 30*p*. Each leg 31 is separated into two fork-shaped legs 31*s*1 and 31*s*2.

In the preassembled position shown in FIG. 1, the catch hook 32, which is located on the leg 31*s*1, blocks the primary catch arm 14 by grasping the primary catch arm 14 from behind and fitting closely on the catch arm.

When a force is exerted in the insertion direction S on the base plate 30*p* of the secondary latching device 30, the secondary latching device 30 is pushed relative to the connector 10 causing the primary catch arm 14 to run onto a ramp 17, whereby the catch hook 32 engages in the corresponding catch hook recess 16 of the primary catch arm 14. When this occurs, the primary catch arm 14 can then rebound and the blocking caused by the secondary catch arm 31 is released (see FIG. 2).

Guide arms 34 provide for the proper guiding of the secondary latching device 30 into the connector 10 and additionally to separate a shorting bar (not shown) between the contact pins 51, in the secondary latching position.

In FIG. 3 the locked setup of the electrical pin-and-socket connector is shown, in which the secondary latching device 30 is completely inserted in the connector 10 and projections 33 of the secondary latching device 30 engage in corresponding recesses 18 of the connector 10. In this position, the catch hooks 32 and dismantling catches 35 located on the secondary catch arm at the top block the primary catch arm 14 so that the latch 15 is locked in the latch recess 55 and cannot detach.

In FIG. 5 the disconnecting of the connector 10 from the socket 50 is shown. For this to occur, the secondary latching device 30 must first be pulled out against the spring resistance of the pull-back springs 19 and against the resistance of the projections 33 on the legs 31*s*1/31*s*2 which are locked into the recesses 18. This resistance will occur until the dismantling catches 35 clear the casing cover 1*d* and the catch hooks 32 engage the second catch hook recesses 16.2. Thus, the primary catch arm 14 and the latch 15 are released from the latch recess 55. In FIG. 6 the secondary latching device 30, remand from the connector is shown in a perspective view.

LIST OF REFERENCE NUMBERS

10 connector
11 casing
11*a* casing recess
11*d* casing cover
11*u* casing shell
12 plug contacts
14 catch arm
15 latch
16/16.2 catch hook recess
17 ramp
18 recesses
19 pull-back spring
30 secondary latching device
30*p* base plate
31 secondary catch arm
31*s*1/31*s*2 leg
32 catch hook
33 projection
34 guiding arm
35 dismantling catch
50 socket
51 contact pins
52 isolating ring
55 latch recess
S insertion direction
SR secondary locking direction
PR primary locking direction

The invention claimed is:

1. An electrical pin-and-socket connector for use between a socket (50) (primer) and an electrical control device for a retention system in motor vehicles, comprising:

a) a connector (10) with a casing (11) to insert in the socket (50) and to contact the plug contacts (12) of the connector (10) with contact pins (51) positioned in the socket (50);

b) a latch (15) to lock the connector (10) in the socket (50) in a primary latching position by engaging the latch (15) in a corresponding recess (55) in the socket (50); and c) a secondary latching device (30), which is movable in an insertion direction S of the connector (10), for latching the connector (10) in the primary latching position, and which is formed by a base plate (30*p*) and at least one of the secondary catch arms (31) projecting from the base plate (30*p*) in an insertion direction S;

d) whereby in a preassembled position, the secondary latching device (30) is positioned relative to the connector (10) in such a way that the latch (15) is blocked and the secondary latching device (30) is movable first through action of force on the secondary latching device (30), especially through pressure on the base plate (30*p*), in insertion direction S with the secondary latching device (30) in a release position relative to the connector (10) in which the latch (15) is released, and the connector (10) is movable through further action of force on the secondary latching device (30), especially by pressure on the base plate (30*p*), in insertion direction S in the primary latching position, whereby in a release position relative to the connector (10), the secondary latching device (30) is substantially flush with the connector (10) to provide a visual indication of the completed connection from outside the connector (10).

2. The electrical pin-and-socket connector according to claim 1, wherein the secondary catch arm (31), in particular, running parallel to the primary catch arm, grasps the primary catch arm (14) from behind on the side turned away from the latch (15).

3. The electrical pin-and-socket connector according to claim 1, wherein the secondary catch arm (31) is designed so it is axially symmetrical.

4. The electrical pin-and-socket connector according to claim 1, wherein the secondary latching device (30) has two secondary catch arms (31) that project from the edge of the base plate (30*p*).

5. The electrical pin-and-socket connector according to claim 1, wherein the secondary latching device is designed so it is axially symmetric.

6. The electrical pin-and-socket connector according to claim 1, wherein the latch (15) is attached to a primary catch arm (14) of the connector (10) in insertion direction S and projects from it.

7. The electrical pin-and-socket connector according to claim 6, wherein the latch (15) in the preassembled position is blocked by a catch hook (32), which is attached to the secondary catch arm (31) and which projects from the secondary catch arm (31) essentially in the direction of the latch (15).

8. The electrical pin-and-socket connector according to claim 7, wherein the catch hook (32) is engaged in the catch hook recess (16) of the primary catch arm (14) in the release position thereby releasing the latch.

9. The electrical pin-and-socket connector according to claim 1, wherein the connector (10) locks into the primary latching position in a primary locking direction PR.

10. The electrical pin-and-socket connector according to claim 9, wherein the secondary latching device (30) in a secondary latching position locks in a secondary locking direction SR, which runs orthogonal to the primary locking position PR and to the insertion direction S, engages, and in the secondary latching position locks the connector (10), which is positioned in the primary latching position.

11. The electrical pin-and-socket connector according to claim 10, wherein the secondary latching device (30) has a projection (33) that locks the secondary latching device (30) in the secondary latching position in the connector (10).

12. The electrical pin-and-socket connector according to claim 11, wherein the projection (33) is attached to the secondary catch arm (31) and projects in the secondary locking direction SR from the secondary catch arm (31).

13. The electrical pin-and-socket connector according to claim 10 or 11, wherein the secondary catch arm (31) is formed like a fork and on each leg (31*s*) of the secondary catch arm (31) a projection projects in the opposite direction in secondary locking direction SR.

* * * * *